United States Patent
Reihlen et al.

(10) Patent No.: US 9,478,831 B2
(45) Date of Patent: Oct. 25, 2016

(54) BATTERY COMPRISING A BATTERY CELL WITH AN EXTERNAL AND AN INTEGRATED TEMPERATURE SENSOR, AND A METHOD FOR OPERATING SAID BATTERY

(71) Applicants: Robert Bosch GmbH, Stuttgart (DE); Samsung SDI Co., Ltd., Yongin-si, Gyeonggi-do (KR)

(72) Inventors: Eckart Reihlen, Engels (RU); Jens Schneider, Leonberg (DE); Anne Heubner, Stuttgart (DE); Christian Pankiewitz, Stuttgart (DE); Fabian Henrici, Stuttgart (DE); Peter Fischer, Gerlingen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 251 days.

(21) Appl. No.: 14/358,662

(22) PCT Filed: Nov. 12, 2012

(86) PCT No.: PCT/EP2012/072397
§ 371 (c)(1),
(2) Date: May 15, 2014

(87) PCT Pub. No.: WO2013/072279
PCT Pub. Date: May 23, 2013

(65) Prior Publication Data
US 2014/0377598 A1 Dec. 25, 2014

(30) Foreign Application Priority Data

Nov. 18, 2011 (DE) .................... 10 2011 086 616
Jun. 19, 2012 (DE) .................... 10 2012 210 262

(51) Int. Cl.
*H01M 10/42* (2006.01)
*H01M 10/48* (2006.01)
(Continued)

(52) U.S. Cl.
CPC ............ *H01M 10/486* (2013.01); *G01K 13/00* (2013.01); *G01K 15/00* (2013.01); *G01R 31/362* (2013.01);
(Continued)

(58) Field of Classification Search
None
See application file for complete search history.

(56) References Cited

U.S. PATENT DOCUMENTS

2006/0196954 A1* 9/2006 Okuda ................ H01M 10/486
236/49.3

FOREIGN PATENT DOCUMENTS

CN        201038244 Y    3/2008
CN        201754422 U    3/2011
(Continued)

OTHER PUBLICATIONS

U.S. Appl. No. 13/630,660, filed Sep. 2012, Raghavan; Ajay.*
International Search Report corresponding to PCT Application No. PCT/EP2012/072397, mailed Feb. 20, 2013 (German and English language document) (7 pages).
(Continued)

*Primary Examiner* — Patrick Ryan
*Assistant Examiner* — Christopher Domone
(74) *Attorney, Agent, or Firm* — Maginot, Moore & Beck LLP

(57) ABSTRACT

A battery includes at least one battery cell that has a housing with an electrode arrangement arranged therein. A first temperature sensor is arranged outside the battery cell housing, and a second temperature sensor is arranged inside the battery cell housing. The temperature dynamic of the second temperature sensor is higher than the temperature dynamic of the first temperature sensor. A motor vehicle includes the battery cell.

13 Claims, 2 Drawing Sheets

(51) Int. Cl.
  *H01M 2/20*   (2006.01)
  *G01R 31/36*  (2006.01)
  *G01K 13/00*  (2006.01)
  *G01K 15/00*  (2006.01)
  *H01M 10/04*  (2006.01)

(52) U.S. Cl.
  CPC ......... *H01M 2/202* (2013.01); *H01M 10/0431* (2013.01); *H01M 10/425* (2013.01); *H01M 10/4207* (2013.01); *H01M 10/4235* (2013.01); *H01M 10/4257* (2013.01); *H01M 10/482* (2013.01); *G01K 2205/00* (2013.01); *G01R 31/3658* (2013.01); *H01M 2010/4271* (2013.01); *H01M 2010/4278* (2013.01); *H01M 2200/10* (2013.01); *H01M 2220/20* (2013.01)

(56) References Cited

FOREIGN PATENT DOCUMENTS

| | | |
|---|---|---|
| DE | 199 61 311 A1 | 7/2001 |
| DE | 100 56 972 A1 | 5/2002 |
| DE | 10 2008 046 510 A1 | 3/2010 |
| DE | 10 2010 007 076 A1 | 8/2011 |
| WO | 2011/067556 A1 | 6/2011 |

OTHER PUBLICATIONS

Makinwa et al.; A CMOS Temperature-to-Frequency Converter with an Inaccuracy of Less Than ±0.5 °C (3σ) From −40 °C to 105 °C; IEEE Journal of Solid-State Circuits; Dec. 2006; pp. 2992-2997; vol. 41, Issue No. 12; New Jersey, USA (6 pages).

* cited by examiner

BATTERY COMPRISING A BATTERY CELL WITH AN EXTERNAL AND AN INTEGRATED TEMPERATURE SENSOR, AND A METHOD FOR OPERATING SAID BATTERY

This application is a 35 U.S.C. §371 National Stage Application of PCT/EP2012/072397, filed on Nov. 12, 2012, which claims the benefit of priority to Ser. Nos. DE 10 2011 086 616.7, filed on Nov. 18, 2011 in Germany, and DE 10 2012 210 262.0 filed on Jun. 19, 2012 in Germany, the disclosures of which are incorporated herein by reference in their entirety.

BACKGROUND

The present disclosure relates to a battery comprising a battery cell, preferably a lithium-ion battery cell, in which an external and a battery-cell-internal temperature sensor are arranged.

It is becoming apparent that in the future battery systems will be used to an ever greater extent both in stationary applications and in vehicles such as hybrid and electric vehicles. In particular, batteries are increasingly being used as traction batteries for use in hybrid and electric vehicles and thus for supplying electric drives. FIG. 1 shows such a battery 200 from the prior art. It comprises a battery cell 100 having a housing 70 and a cell core comprising an electrode arrangement 10 for generating energy.

Mathematical battery models are used for the operation of the battery 200. In this case, however, internal resistances and time constants of the dynamic battery cell behavior under load are greatly dependent on the temperature in the cell core in which the chemical reactions take place. On account of load-governed production of heat, the temperature in the cell core can change rapidly.

According to the prior art, the temperature measurement on battery cells takes place by means of temperature sensors that are usually fitted on the housing. In this regard, DE 199 61 311 A1 discloses a temperature sensor that is fixed to the battery from outside by means of a battery terminal. The temperature-dependent battery model parameters are then mapped onto the housing temperature offline or online. However, the exterior temperature of the housing does not correspond to the core temperature in the interior of the housing at the electrode arrangement, nor is it unambiguously linked thereto. Consequently, a change in the core temperature is measured in a delayed fashion or is not measured at all on the battery cell housing owing to thermal contact resistances within the cell and toward the outside.

The inaccurate detection of the present temperature in the cell core leads, as a consequence, to inaccuracies in temperature-dependent battery models of the operating state of the battery. The battery models can be used both in the battery control unit for monitoring and controlling the operation of the battery and outside the battery in an offline simulation.

DE 100 56 972 A1 discloses a battery cell in which sensors for determining the battery temperature are arranged in the housing of a battery cell. The temperature sensors are embodied as temperature detectors and connected to the exterior region of the battery housing via electrical lines. Although the installation of customary measuring probes, containing e.g. an NTC measuring unit of conventional three-dimensional design, in the interior of the battery cell can detect the cell core temperature, it nevertheless influences the evolution of heat and the heat flows in the battery as a result of the detection and evaluation units and the signal lines.

Furthermore, Makinwa and Snoeij ("A CMOS Temperature-to-Frequency Converter With an Inaccuracy of less than +−0.5° C. (3σ) from −40° C. to 105° C", K. A. A. Makinwa, Martijn F. Snoeij, IEEE Journal of Solid-State Circuits, vol. 41, no. 12, December 2006, pages 2992-2997) disclose a temperature-to-frequency converter that is implemented in a standard CMOS method.

Furthermore, the battery can also contain a cooling system for cooling the battery cells. A further temperature sensor can then be arranged in the cooling system.

According to the prior art, both the temperature sensor on the housing and the temperature sensor in the cooling system can have a high accuracy with regard to their absolute temperature measurement capability, but are sluggish when detecting fast temperature changes within the battery cell owing to the installed position and the heat transfer path. This results in a delayed reproduction of a temperature rise in the interior of the battery cell, particularly in the case of safety-critical—on account of being very fast—temperature rises owing to a short circuit.

SUMMARY

The disclosure proposes a battery comprising at least one battery cell, preferably a lithium-ion battery cell, having a housing, in which an electrode arrangement is arranged, a first temperature sensor, which is arranged outside the battery cell housing, and a second temperature sensor, which is arranged in the interior of the battery cell housing. In this case, the temperature dynamic range of the second temperature sensor is higher than the temperature dynamic range of the first temperature sensor.

Advantageously, the battery can react to safety-critical states faster by means of the second temperature detector. Temperatures can be detected where the chemical reactions take place, that is to say within the battery cell housing, but without influencing the evolution of heat and temperature as a result of signal lines, detection or evaluation units. Consequently, as a result of the detection of the housing interior temperature, a battery model in the battery control unit can be parameterized more accurately and be evaluated better for simulation and state identification and prediction purposes.

The battery according to the disclosure preferably comprises a plurality of battery cells arranged in series, wherein a plurality of the battery cells have a first temperature sensor arranged outside the respective battery cells, and at least one of the battery cells has a second temperature sensor arranged in the interior of the housing of the relevant battery cell.

Just by virtue of the use of a temperature sensor, the safety of the battery can be increased since a safety-critical state is detected faster.

The battery furthermore preferably comprises a battery control unit designed to receive and process the temperatures of the first and second temperature sensors, and a battery isolating unit designed to isolate the battery from a connected electrical circuit when a threshold value of the temperature dynamic range of the second temperature sensor is exceeded and/or when the temperature value of the second temperature sensor is exceeded.

Furthermore, in addition or else as an alternative thereto, the battery control unit is designed to calibrate the second temperature sensor upon thermal equilibrium, that is to say after a relatively long quiescent phase of the battery, by means of the first temperature sensor.

Moreover, a third temperature sensor can be arranged in a cooling system of the battery cells in the battery.

The first temperature sensor is preferably a temperature detector, for example an NTC thermistor or a PTC thermistor. These advantageously have a high accuracy of the absolute temperature value.

The second temperature sensor is preferably embodied as a differential temperature sensor. The disclosure enables a dynamic detection of temperature changes in the cell ($\Delta T/dt$). Preferably, the dynamic range values $\Delta T/dt$ of the second temperature sensor in the interior of a battery cell are between 0.5 K/min and 5 K/min. The dynamic range values of the first temperature sensor then lie below the range of values of the second temperature sensor.

The second temperature sensor is preferably integrated in an integrated circuit in a microchip. The integrability in the interior of the housing enables a small design which is cost-effective and robust toward influences from outside.

The second temperature sensor preferably comprises a CMOS oscillator, that is to say a thermal oscillator realized using CMOS technology in an integrated circuit. In the case of complementary metal oxide semiconductors ("CMOS"), both p-channel and n-channel field effect transistors are used on a common substrate. The advantage of this construction is that it can be integrated directly into an application specific integrated circuit (ASIC) and supplies a temperature-proportional frequency signal. The electrothermal oscillator preferably comprises a thermopile having thermoelements. Thermoelements have the advantage over transistors that they have no offset and are free of 1/f noise.

In a different exemplary embodiment, the second temperature sensor comprises a temperature-dependent bipolar transistor. In other words, the disclosure comprises temperature sensors integrated in a microchip on the basis of the temperature dependence of the silicon diode characteristic curve, such as e.g. band gap temperature sensors. Here as well, the second temperature sensor can be integrated directly into an application specific integrated circuit (ASIC).

In one configuration of the disclosure, the quasi-digital output signal of the second temperature sensor is passed out of the housing by means of power line communication. As a result, the sensor can be integrated into a cell, without necessitating additional power lines toward the outside through the housing wall.

The electrode arrangement preferably consists of a winding of a first and a second electrode with a separator therebetween, and, in one exemplary embodiment, the temperature sensor is arranged directly on the winding.

The electrode arrangement is preferably connected to at least one current collector which passes the current of the electrode arrangement out of the housing, and the temperature sensor is preferably thermally coupled to the current collector, even more preferably arranged directly on the at least one current collector. In one preferred configuration of the disclosure, the temperature sensor is electrically connected to the electrode arrangement for its energy supply. Since the current collector is directly coupled to the cell winding and taps off the current from the electrode arrangement, the temperature sensor can directly determine the temperature at the cell winding and simultaneously draw the current for its operation from the cell winding.

Furthermore, a motor vehicle comprising a battery cell according to the disclosure is proposed, wherein the battery cell is connected to the drive of the motor vehicle.

In addition, a method for operating a battery is proposed, which method comprises the steps of determining the temperature outside the battery cells by means of the at least one first temperature sensor, determining the change in the temperature rise of the second temperature sensor, and isolating the battery from a connected electrical circuit when a threshold value of the temperature rise of the second temperature sensor is exceeded, and/or when a threshold value of the temperature of the second temperature sensor is exceeded.

The method can furthermore determine the temperatures of the first temperature sensor and of the second temperature sensor in the quiescent phase of the battery and, in the case of deviation of the temperature values, calibrate the second temperature sensor with the aid of the temperature of the first temperature sensor.

Advantageous developments of the disclosure are specified in the dependent claims and described in the description.

BRIEF DESCRIPTION OF THE DRAWINGS

Exemplary embodiments of the disclosure are explained in greater detail with reference to the drawings and the following description. In the figures.

DETAILED DESCRIPTION

Figure 1:
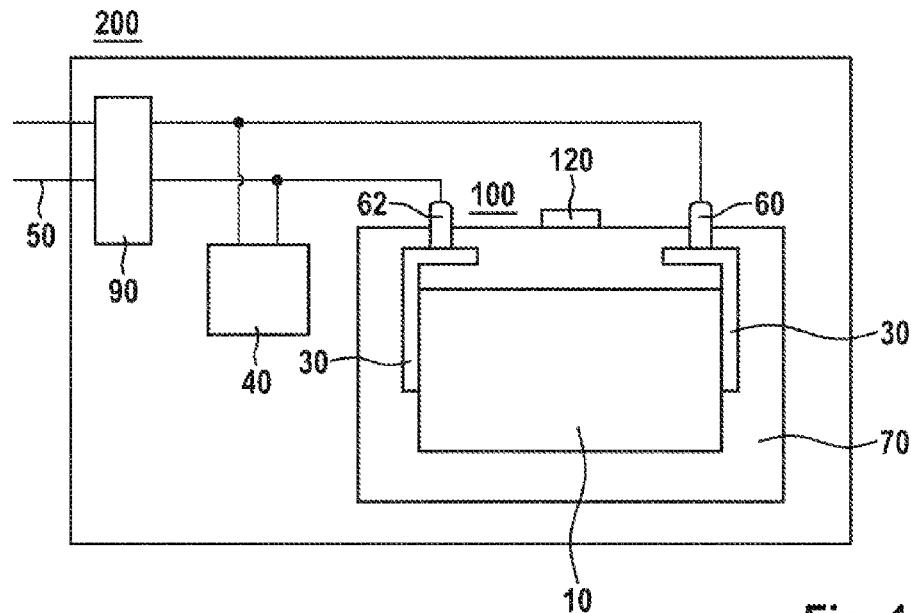
FIG. 1 shows a battery from the prior art.

FIG. 1 shows a battery 200 from the prior art. The battery 200 comprises a battery control unit 40 and a battery cell 100 having a housing 70. Arranged in the interior of the housing 70 is a cell core, an electrode arrangement 10. The electrode arrangement 10 preferably comprises a first, positive electrode and a second, negative electrode, which are separated by a separator. The electrodes are preferably wound with the separator therebetween. Contact is made with the electrode arrangement 10 by current collectors 30 at two opposite sides. One current collector 30 makes contact with the first electrode 11, and the second current collector 30 makes contact with the second electrode 12. The current collectors 30 are connected to a first and a second terminal 60, 62. The terminals 60, 62 pass the current out of the housing 70 of the battery cell 100. Via electrical connection lines 50, the battery control unit 40 is connected to the terminals 60, 62 of the battery cell 100. The battery control unit 40 controls the operation of the battery 200, such as charging and discharging processes. A battery model is preferably implemented in the battery control unit 40. It serves for monitoring the battery 200. Furthermore, the battery 200 has a battery isolating unit 90, which isolates the battery 200 from an external electrical circuit (not shown) in the case of safety-critical states.

Figure 2:
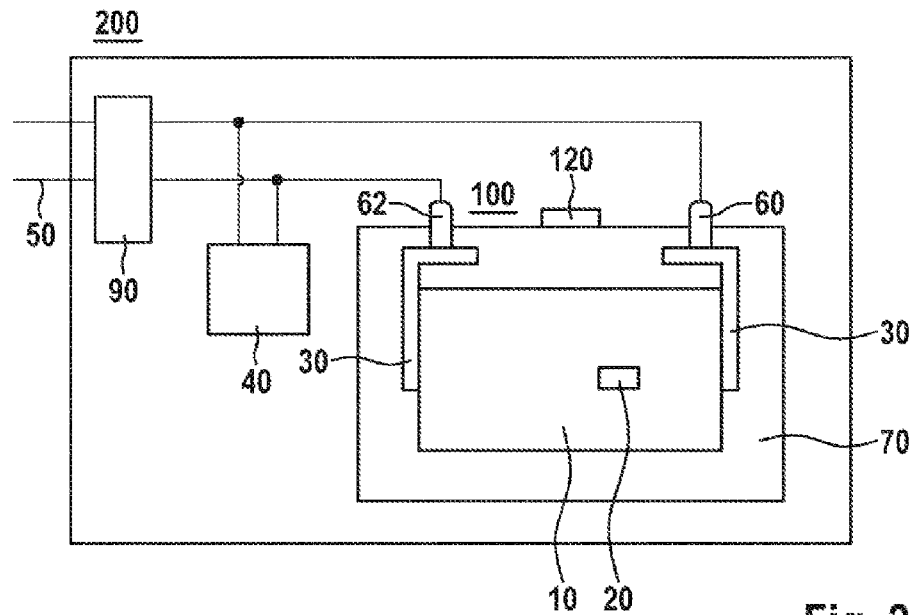
FIG. 2 shows a battery according to the disclosure comprising a battery cell and a temperature sensor in the interior of the battery cell housing.

FIG. 2 then shows a battery 200 according to the disclosure. It substantially corresponds to the construction of the battery 200 from the prior art in FIG. 1, but has a second temperature sensor 20 in the interior of the battery cell 100. However, the battery 200 according to the disclosure can also have a plurality of battery cells 100, which are preferably arranged alongside one another.

The second temperature sensor 20 converts temperatures into frequencies, that is to say supplies a temperature-proportional frequency signal. It comprises a thermal oscillator, preferably, but without restriction, a thermal oscillator that is integrated by means of CMOS technology on a microchip in an application specific integrated circuit.

The thermal oscillator is preferably a CMOS temperature-to-frequency converter as disclosed by Makinwa and Snoeij ("A CMOS Temperature-to-Frequency Converter With an Inaccuracy of less than +−0.5° C. (3σ) from −40° C. to 105° C.", K. A. A. Makinwa, Martijn F. Snoeij, IEEE Journal of Solid-State Circuits, vol. 41, no. 12, December 2006, pages 2992-2997).

Advantageously, by means of this construction, the quasi-digital output signal can be passed out of the battery housing toward the outside in a simple manner via already existing current paths. There is no need for any additional bushings through the housing for power lines.

Alternatively, however, an approach based on bipolar technology can also be used. The output signal, preferably the voltage, can then expediently be converted digitized.

It is particularly expedient, for example, to position the second temperature sensor 20 directly on the cell winding 10 as in FIG. 2. In this regard, the electrode temperature can be measured directly and at the same time the second temperature sensor 20 can be supplied with power. Said temperature sensor is then electrically connected to the first and second electrodes.

In a further configuration, the second temperature sensor 20 can also be positioned directly on at least one of the current collectors 30 of the cell winding 10. The current collectors 30 usually have a high thermal conductivity, are composed of metal and can therefore readily forward the cell winding temperature to the second temperature sensor 20.

The second temperature sensor 20 in the interior of the housing 70 can also be supplied with power externally via the terminals 60, 62.

The measured second temperature is preferably modulated onto the power line paths (terminal-current collector-electrode arrangement) present in the interior of the battery. From there, the temperature can then be communicated to the battery control unit 40 via power lines 50. The temperature information can be passed out of the housing 70 capacitively and inductively by the oscillations of the second temperature sensor 20 being coupled onto the power line paths. The oscillations are coupled out again outside the battery cell 100 by a means for coupling out oscillations (not shown) and are used in the battery control unit 40 in the battery model implemented there.

This can take place online, that is to say during the operation of the battery cell 100, but also offline in the quiescent state of the battery cell 100. In the latter case, energy is then applied to the second temperature sensor 20 externally.

A cell model parameterized and adapted to the respective type of battery cell 100 is used in the battery control unit 40. The measured current normally flows together with the measured temperature as input variable into this model, which simulates the resultant voltage and compares it with the measured voltage in order to readjust model parameters, to determine the state of charge, to provide predictions for current or power, and much more.

If the temperature measurement value according to the disclosure from the cell core is then used either online or offline, preferably in both applications, the dynamic behavior of the cell can be calculated and predicted significantly better.

Figure 3:
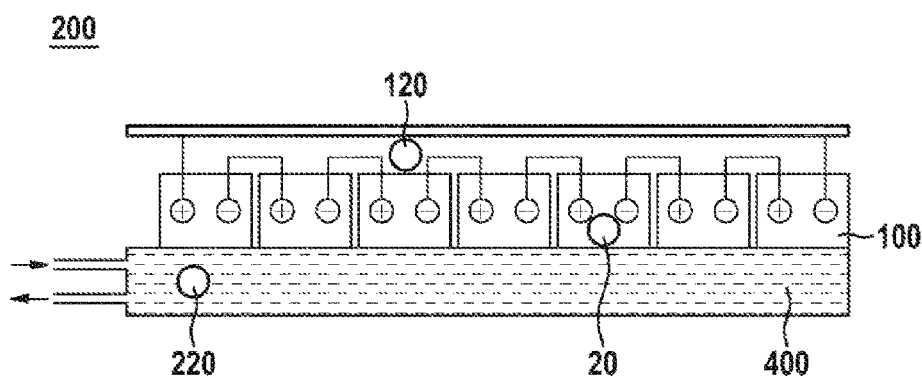
FIG. 3 shows a battery according to the disclosure comprising a cooling system and a third temperature sensor.

FIG. 3 furthermore shows a battery 200 according to the disclosure in a further configuration comprising a plurality of battery cells 100, wherein the battery cells 100 are cooled for example from below by means of a cooling system 400, preferably a water cooling system 400. A third temperature sensor 220, which is preferably likewise a temperature detector like the first temperature sensor 120, is situated in the cooling system 400.

According to the disclosure, the temperatures of the second temperature detector can contribute to increasing the safety of the battery 200.

In this case, the absolute accuracy of the second temperature sensor 20 is of secondary importance; what is crucial is a high dynamic range when detecting temperature changes over time. In other words, the second temperature sensor 20 has a higher dynamic range than the first and/or the third temperature sensor 120, 220. It reacts faster to temperature changes than the two outer temperature sensors 120, 220.

Preferably, the absolute temperature accuracy of the second temperature sensor 20 is lower than the accuracy of the first and third temperature sensors 120, 220. As a result, the second temperature sensor 20 can be embodied more cost-effectively.

If the second temperature sensor 20 is integrated in each battery cell 100, the increase in safety is the highest. In this regard, a great temperature rise in each battery cell 100 can be registered immediately. Starting from a certain threshold for $\Delta T_2/dt$, the battery isolating unit 90 opens battery contactors and isolates the battery 200 from an external electrical circuit. This can preferably likewise take place if an absolute value threshold of the temperature $T_2$ is exceeded.

If the second temperature sensor 20 is not integrated in each battery cell 100, then it nevertheless registers critical temperature rises in neighboring cells 100 faster than the conventional temperature monitoring, since the temperatures are after all the highest in the cell core 10 and are thus also transferred faster to the cell cores 10 than to the housings 70 or terminals 60, 62.

After a relatively long quiescent phase of the battery 200, in thermal equilibrium, the second and/or the third temperature of the first and/or third temperature sensor can be used for adjusting the temperature of the second temperature sensor 20. By way of example, $T_2=T_1$ or $T_2=T_1=T_3$ can then be set.

Advantageously, a lower absolute accuracy of the second temperature sensor 20 can thus be compensated for by the temperature $1_2$ of the second temperature sensor 20 being calibrated with the aid of the first and/or third temperature sensors 120, 220, which are more accurate in absolute terms.

The battery control unit 40 according to the disclosure is designed to carry out the calibration and/or the isolation of the battery 200 by means of the second temperature sensor 20 in the event of T2 or $\Delta T_2/dt$ exceeding a threshold value.

Furthermore, the change values $\Delta T_1/dt$ and/or $\Delta T_3/dt$ can also be used in a redundant fashion for increasing the safety. In this regard, the temperature variations $\Delta T_1/dt$ and $\Delta T_3/dt$ of the first and/or third temperature sensor 120, 220 can be used for assessing the temperature rise in the battery cell 100. The temperature measurement values T1, T2, T3 and the associated $\Delta T/dt$ can thus be rendered plausible relative to one another as a result of which the operational reliability can be increased. Secondly, the cell core temperature of cells which do not have an integrated temperature detector can be deduced with higher accuracy.

Figure 4:
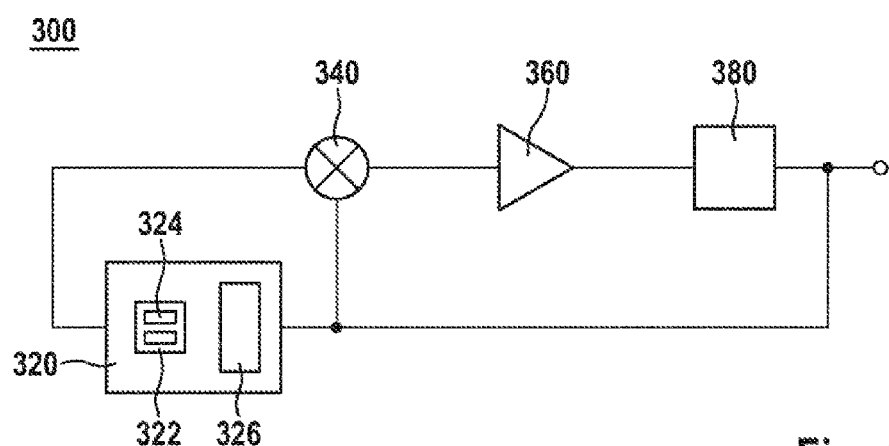
FIG. 4 shows one embodiment of a thermal oscillator.

FIG. 4 shows an exemplary embodiment of a thermal oscillator 300 used in the disclosure. The thermal oscillator 300 comprises an electrothermal filter 320 having a heating element 326 and a thermopile 322, which has various thermoelements 324. In this case, the thermoelements 322 are embodied as thin-film structures. They can be p+diffusion/aluminum thermoelements 324, for example. The advantage of thermoelements 324 over transistors or resistors is that they have no offset and are free of 1/f noise. Furthermore, the thermal oscillator comprises a multiplier 340, an integrator 360 and a voltage-controlled oscillator 380. The thermopile 320, the heating element 326 and the voltage-controlled oscillator 380 are connected to the multiplier via a feedback loop. The phase offset of the electrothermal filter 320 consequently determines the frequency of the voltage-controlled oscillator 380. The phase offset of the electrothermal filter 320 arises as a result of the delay between the generation of a thermal pulse (brief increase in temperature) at the heating element 326 and the identification or conversion back into a voltage pulse at the thermopile 322. This phase shift is dependent on the basic temperature of the substrate on which the thermal oscillator is constructed, said substrate in turn assuming the temperature of the surroundings. As a result, the oscillation frequency of the thermal oscillator 300 becomes dependent on the temperature of the battery cell 100.

The invention claimed is:

1. A battery, comprising:
   at least one battery cell having a housing and an electrode arrangement arranged in the housing;
   a first temperature sensor arranged outside the battery cell housing; and
   a second temperature sensor arranged in an interior of the battery cell housing,
   wherein the temperature dynamic range of the second temperature sensor is higher than the temperature dynamic range of the first temperature sensor.

2. The battery as claimed in claim 1, further comprising a plurality of battery cells arranged in series, wherein a plurality of the battery cells have a first temperature sensor arranged outside the battery cells, and wherein at least one of the battery cells has a second temperature sensor arranged in an interior of the housing of the relevant battery cell.

3. The battery as claimed in claim 1, wherein the second temperature sensor comprises an electrothermal oscillator that converts a temperature into a frequency.

4. The battery cell as claimed in claim 3, wherein the second temperature sensor has a temperature dynamic range of between 0.5 K/min and 5 K/min.

5. The battery cell as claimed in claim 1, wherein the second temperature sensor is integrated in an integrated circuit in a microchip.

6. The battery as claimed in claim 1, wherein the first temperature sensor is a temperature detector.

7. The battery as claimed in claim 1, further comprising:
   a battery control unit configured to receive and process the temperatures of the first and second temperature sensors; and
   a battery isolating unit configured to isolate the battery from the power supply when a threshold value of one or more of the temperature dynamic range of the second temperature sensor is exceeded and the temperature value of the second temperature sensor is exceeded.

8. The battery as claimed in claim 7, wherein the battery control unit is further configured to calibrate the second temperature sensor upon thermal equilibrium by use of the first temperature sensor.

9. The battery as claimed in claim 1, further comprising a third temperature sensor arranged in a cooling system of the battery cells in the battery.

10. A motor vehicle, comprising:
    a battery including:
       at least one battery cell having a housing and an electrode arrangement arranged in the housing;
       a first temperature sensor arranged outside the battery cell housing; and
       a second temperature sensor arranged in an interior of the battery cell housing,
       wherein the temperature dynamic range of the second temperature sensor is higher than the temperature dynamic range of the first temperature sensor,
    wherein the battery is connected to a drive of the motor vehicle.

11. A method for operating a battery, the battery including at least one battery cell having a housing and an electrode arrangement arranged in the housing, at least one first temperature sensor arranged outside the battery cell housing, and at least one second temperature sensor arranged in an interior of the battery cell housing, the temperature dynamic range of the second temperature sensor being higher than the temperature dynamic range of the first temperature sensor, the method comprising:
    determining the temperature outside the at least one battery cell by use of the at least one first temperature sensor;
    determining the change in the temperature rise of the second temperature sensor; and
    isolating the battery from a connected electrical circuit when one or more of a threshold value of the temperature rise of the second temperature sensor is exceeded and a threshold value of the temperature of the second temperature sensor is exceeded.

12. The method for operating a battery as claimed in claim 11, further comprising:
    determining the temperatures of the first temperature sensor and of the second temperature sensor in the quiescent phase of the battery; and
    calibrating the second temperature sensor with the aid of the temperature of the first temperature sensor in the case of deviation of the temperature values.

13. The battery as claimed in claim 3, wherein the second temperature sensor is configured as a differential temperature sensor.

* * * * *